United States Patent
Kagawa et al.

[11] Patent Number: 5,969,290
[45] Date of Patent: Oct. 19, 1999

[54] THERMOELECTRIC MODULES AND THERMOELECTRIC ELEMENTS

[75] Inventors: Shuzo Kagawa, Kobe; Isao Endo, Ikoma; Hideki Satake, Sakai; Michio Yamaguchi, Hirakata, all of Japan

[73] Assignee: Kubota Corporation, Osaka, Japan

[21] Appl. No.: 08/904,631

[22] Filed: Aug. 1, 1997

[30] Foreign Application Priority Data

Aug. 27, 1996 [JP] Japan .................................. 8-224820
May 14, 1997 [JP] Japan .................................. 9-123840

[51] Int. Cl.⁶ .................................................. H01L 35/34
[52] U.S. Cl. .......................... 136/201; 136/203; 136/205; 29/825; 29/875; 62/3.2
[58] Field of Search ..................................... 136/200, 201, 136/203, 228, 205; 29/874, 875, 876, 825; 62/3.2

[56] References Cited

U.S. PATENT DOCUMENTS

5,487,952  1/1996  Yoo et al. ................................ 428/552
5,763,293  6/1998  Yamashita et al. ....................... 438/55

*Primary Examiner*—Kathryn Gorgos
*Assistant Examiner*—Wesley A. Nicolas
*Attorney, Agent, or Firm*—Armstrong, Westerman Hattori, McLeland & Naughton

[57] ABSTRACT

The invention provides a thermoelectric element produced by placing a powder of thermoelectric material over an electrode plate first and then an electrode plate over the power to form superposed layers, and thereafter sintering the powder with a pressure applied thereto perpendicular to the superposed layers. The electrode plates and the thermoelectric material are joined into an integral assembly before fabricating a thermoelectric module. The invention provides a thermoelectric module which is produced by arranging p-type thermoelectric elements and n-type thermoelectric elements alternately in a row at a predetermined interval, each of the elements comprising a thermoelectric material provided between and joined to a pair of opposed electrode plates, and interconnecting pairs of spaced adjacent upper electrode plates and pairs of spaced adjacent lower electrode plates alternately by brazing to electrically connect the p-type and n-type thermoelectric elements in series. Another thermoelectric module of the invention is fabricated by preparing a plurality of submodules each comprising p-type thermoelectric elements and n-type thermoelectric elements arranged alternately in an elongated row and electrically connected in series through electrode plates, arranging the submodules side by side suitably, and brazing the electrode plate of the p-type thermoelectric element at an end position of each submodule to the electrode plate of the n-type thermoelectric element at a corresponding end position of another submodule adjacent to the submodule so as to electrically connect the plurality of submodules in series.

9 Claims, 12 Drawing Sheets

THERMOELECTRIC MODULES AND THERMOELECTRIC ELEMENTS

FIELD OF THE INVENTION

The present invention relates to thermoelectric modules and thermoelectric elements.

BACKGROUND OF THE INVENTION

Thermoelectric modules comprise a p-type thermoelectric element and an n-type thermoelectric element which are electrically connected in series via an electrode plate. A temperature difference of both sides of the pair of p-type and n-type elements develops a potential difference therebetween. Further if a current is passed through the junctions, heat is absorbed or generated depending on the direction of the current. The former phenomenon is termed the Seebeck effect and used for thermoelectric generation, for example, with the waste heat of refuse incinerators. The latter phenomenon is called the Peltier effect, which has found wide use, for example, in constant-temperature devices for semiconductor manufacturing processes and in thermoelectric cooling of electronic devices.

Such thermoelectric modules are produced conventionally by the process to be described below with reference to FIG. 23.

First, each of p-type and n-type thermoelectric materials is melted in a quartz ampule and then gradually crystallized in one direction to prepare an ingot, which is cut to obtain pieces of suitable size (e.g., several millimeters square). A p-type thermoelectric material 90 and an n-type thermoelectric material 91 are thus prepared as illustrated. To ensure effective joining, an Ni plating layer 92 is formed on each of opposite surfaces of each of the thermoelectric materials 90, 91, and a solder plating layer 94 is further formed over the Ni plating layer. Next, electrodes 98 are each prepared by forming a pattern of Cu directly on a ceramic substrate 96 serving as an electrically insulating material.

The thermoelectric materials 90, 91 are alternately arranged on the Cu electrode 98 on the ceramic substrate 96 in conformity with the pattern, and the other ceramic substrate 96 bearing the pattern of Cu electrode 98 is placed on the thermoelectric materials 90, 91. When the assembly is placed into a heater, the solder layers 94 melt, joining the Ni plating layers 92 of the materials 90, 91 to the Cu electrodes 98 on the ceramic substrates 96, 96.

Figure 23:
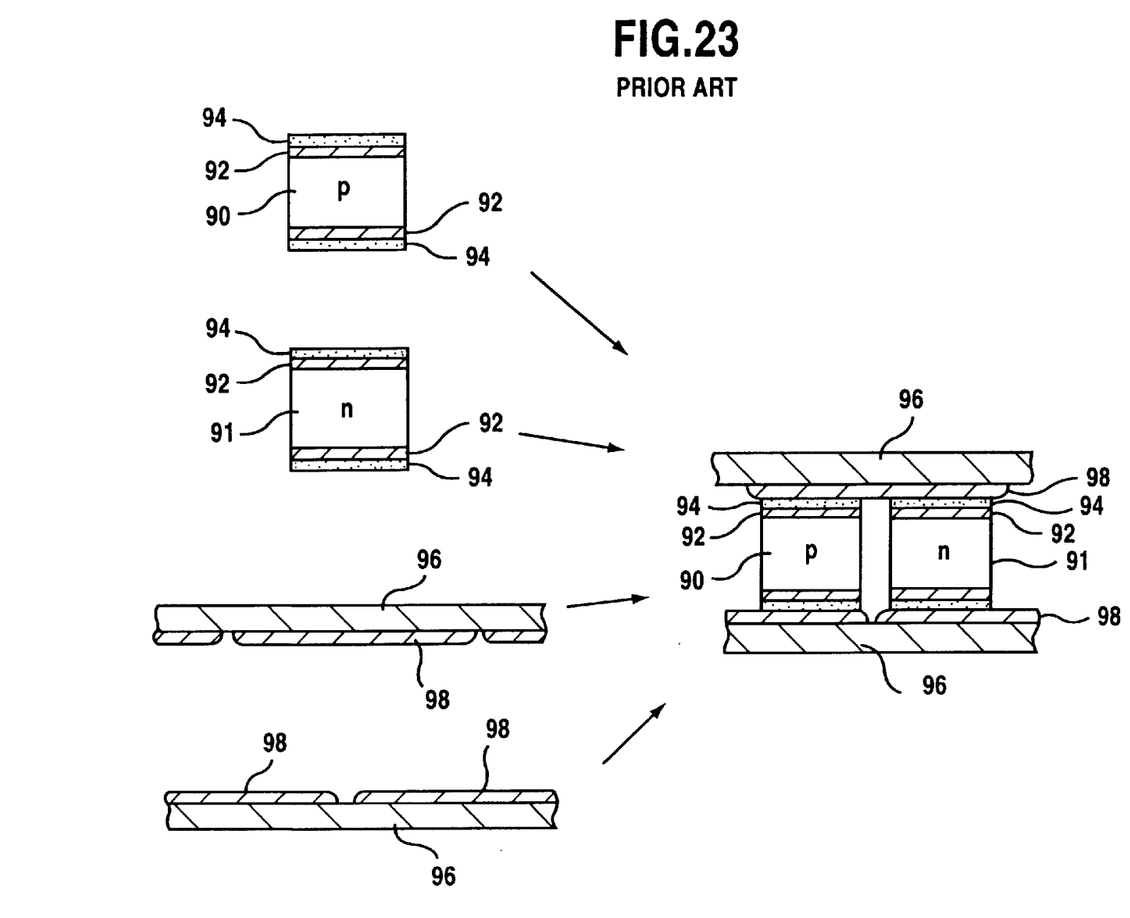
FIG. 23 is a diagram for illustrating a conventional process for preparing a pair of p-type and n-type elements for the fabrication of a thermoelectric module.

Although FIG. 23 shows the p-type thermoelectric material 90 and the n-type thermoelectric material 91, each only one in number, thermoelectric modules usually comprise many pieces of each type of these materials although the number of components is dependent on the performance required.

With the conventional production process, the p-type and n-type thermoelectric materials are joined to the electrodes by soldering when the thermoelectric module is assembled, so that much labor is required for properly arranging small pieces of thermoelectric materials in position on the pattern and for the soldering step.

An object of the present invention is to provide a process including simplified steps for producing a thermoelectric module.

Another object of the invention is to provide thermoelectric elements which are useful for simplifying the process for producing a thermoelectric module.

Still another object of the invention is to provide a process for producing a thermoelectric element for use in simplifying the process for producing a thermoelectric module.

SUMMARY OF THE INVENTION

The present invention provides a thermoelectric element produced by placing a powder of thermoelectric material over an electrode plate first and then an electrode plate over the power to form superposed layers, and thereafter sintering the powder with a pressure applied thereto perpendicular to the superposed layers, the electrode plates and the thermoelectric material being joined into an integral assembly before fabricating a thermoelectric module.

Preferably, the thermoelectric element of the invention comprises a thermoelectric material provided between and joined to a pair of electrode plates, each of the electrode plates having intersecting grooves extending vertically and horizontally and formed in a surface thereof in contact with the thermoelectric material.

The present invention provides, in a broad sense, a process for producing a thermoelectric module comprising p-type thermoelectric elements and n-type thermoelectric elements alternately arranged in a row, the process comprising preparing p-type thermoelectric elements and n-type thermoelectric elements each comprising a thermoelectric material provided between and joined to a pair of opposed electrode plates, arranging the p-type thermoelectric elements and the n-type thermoelectric elements alternately in a row at a predetermined interval, interconnecting pairs of spaced adjacent upper electrode plates and pairs of spaced adjacent lower electrode plates alternately by brazing to electrically connect the p-type thermoelectric elements and n-type thermoelectric elements in series.

Stated more specifically, the present invention provides a process for producing a thermoelectric module comprising p-type thermoelectric elements and n-type thermoelectric elements arranged in vertical and horizontal rows in a flat form, the process comprising preparing a plurality of submodules each comprising p-type thermoelectric elements and n-type thermoelectric elements alternately arranged in a row and electrically connected in series via electrode plates, suitably arranging the submodules, and thereafter brazing the electrode plates of the p-type thermoelectric element and the n-type thermoelectric element at end positions of each two adjacent submodules.

DETAILED DESCRIPTION OF THE INVENTION

First, a description will be given of thermoelectric elements for constituting thermoelectric modules, and processes for producing such thermoelectric elements. Processes will be described next for producing thermoelectric modules with use of thermoelectric elements.

1. Thermoelectric Elements

The term "thermoelectric element" as used herein refers to an assembly comprising a pair of opposed electrode plates and a thermoelectric material provided between and joined to the electrode plates. The term "thermoelectric material" refers to a thermoelectric material in the form of a powder or as sintered. For convenience of description, a sintered body of thermoelectric material may sometimes be referred to as a "thermoelectric member".

(i) Preparation of Thermoelectric Material Powders

Powders of thermoelectric materials are prepared in the following manner.

Predetermined quantities of specified metal powders are measured out to provide a composition of p-type thermoelectric material or n-type thermoelectric material. This measuring procedure is performed in a vacuum or an oxygen-free atmosphere such as a nitrogen gas or inert gas atmosphere. Examples of useful inert gases are argon gas and helium gas.

Examples of useful p-type thermoelectric materials are those represented by $(Bi_2Te_3)_{1-x}(Sb_2Te_3)_x$ wherein x is 0.70 to 0.85, and examples of useful n-type thermoelectric materials are those represented by $(Bi_2Te_3)_{1-x}(Bi_2Se_3)_x$ wherein x is 0.05 to 0.15 although these examples are not limitative. The ratio of the components is an atomic ratio.

The metal powders are mixed together as they are when up to about 10 micrometers in mean particle size. If the mean particle size is greater, the powders are mixed together in a high-energy ball mill or rolling ball mill while being pulverized to obtain a powder of thermoelectric material. The pulverizing-mixing operation is conducted also in a vacuum or nitrogen gas or inert gas atmosphere.

(ii) Electrode Plates

The electrode plates to be used for thermoelectric materials of Bi—Te alloys are preferably Cu plates plated with Ni. Preferably, the Ni plating layer is at least about 20 $\mu$m in thickness. Also usable are Cu plates coated with Mo or Ti by vapor deposition.

Figure 6:
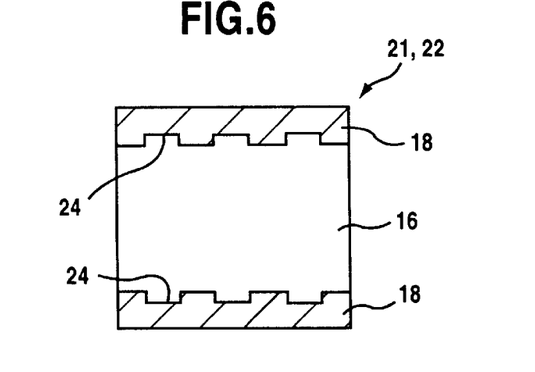
FIG. 6 is a sectional view of a thermoelectric element prepared with use of electrode plates formed with grooves.
Figure 7:
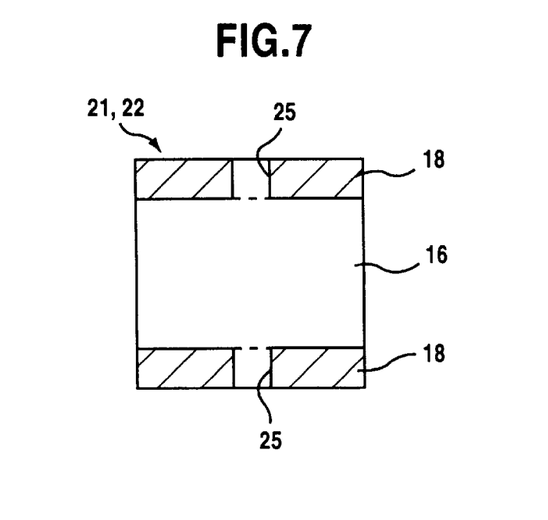
FIG. 7 is a sectional view of a thermoelectric element prepared with use of electrode plates formed with a hole.

As shown in FIGS. 6 or 7, it is desired that the electrode plate 18 be formed with grooves 24 and/or a hole 25 in the surface thereof to be joined to the thermoelectric material 16 because when the thermoelectric material 16 between the plates 18 is sintered under pressure with the grooves or holes filled with the material, the grooves or holes give an increased area of contact between the plates and the material, improving the intimate contact therebetween and affording improved joint strength with respect to the direction along the surface of the electrode plate.

Preferably, the electrode plate 18 has intersecting grooves 24 extending horizontally and vertically in the surface. The grooves can be V-shaped, or rectangular or trapezoidal in cross section.

Preferably, the number of holes 25 to be formed in the electrode plate 18 is such that each of the elements to be finally obtained by cutting has at least one hole 25. If the shape of the holes is so determined that the holes in the electrodes for the p-type thermoelectric material are, for example, circular, and that those in the electrodes for the n-type thermoelectric material are, for example, square, the p-type can be distinguished from the n-type without confusion when elements of specified size are obtained by cutting.

(iii) Preparation of Thermoelectric Elements

Figure 1:
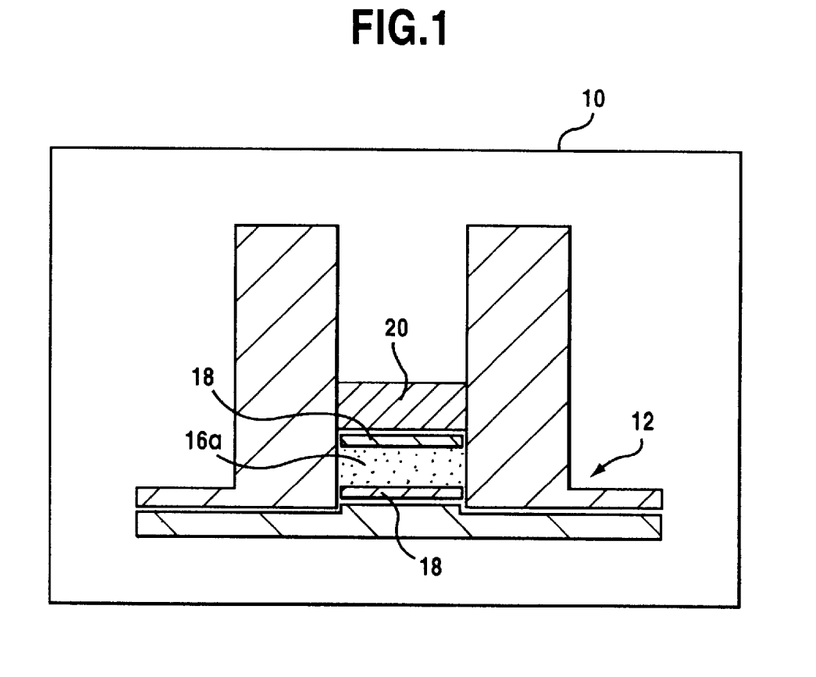
FIG. 1 is a sectional view for illustrating an electrode plate, a powder of thermoelectric material and an electrode plate as superposed in layers within a die accommodated in a glove chamber having a controlled atmosphere.

As shown in FIG. 1, a die 12 is placed into a glove chamber 10 having a vacuum or nitrogen gas or inert gas atmosphere. If the die 12 used has a cavity of square cross section, and when the thermoelectric element then formed is cut to a smaller square piece, the waste portion can be diminished, hence an advantage.

An electrode plate 18 is placed into the die 12, a powder of thermoelectric material 16a is placed in over the plate 18, and another electrode plate 18 is thereafter placed on the powder. A plate member 20 is further placed on the electrode plate 18. The plate member 20 is used to effectively prevent air from penetrating into the powder 16a when the subsequent heating step and pressure sintering step are performed in the atmosphere.

The plate member 20 is shaped and dimensioned in conformity with the internal shape of the die 12. A release agent (such as BN) having high lubricity is applied to the inner surface of the die 12, so that the plate member 20 is slidable inside the die 12.

The die 12 with the plate member 20 placed thereon is withdrawn from the vacuum or the nitrogen gas or inert gas atmosphere into the atmosphere and heated to a temperature of 300 to 550° C. within a heating chamber. This temperature is selected from the range of temperatures permitting the crystallization of the thermoelectric material used.

Figure 2:
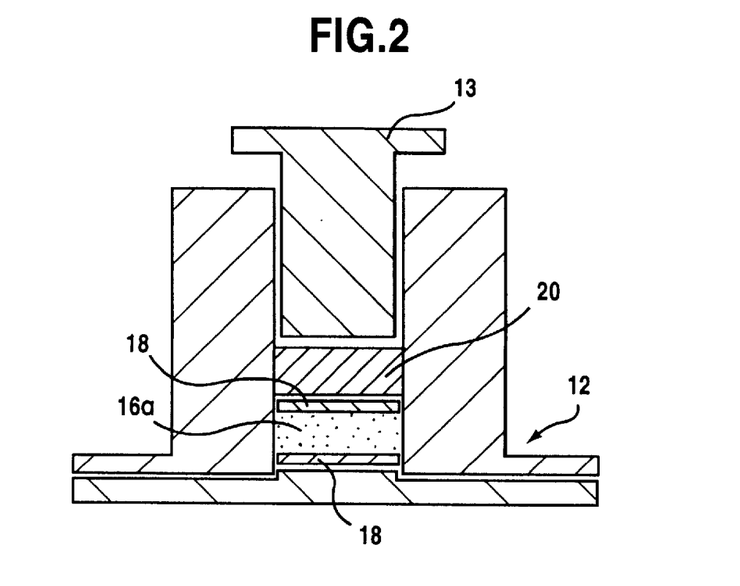
FIG. 2 is a sectional view for illustrating the step of sintering the layer of the powder between the electrode plates in the die with application of pressure.

After the completion of heating, the assembly as placed in the die is promptly brought to the work station of a press, where a punch 13 is inserted into the die as shown in FIG. 2, and the assembly is pressed hot from above the plate member 20, whereby the thermoelectric material 16a is sintered as intimately joined to the upper and lower electrode plates 18, 18.

The assembly is pressed at a pressure of at least 1000 kgf/cm² in the atmosphere, preferably at a temperature of 300 to 550° C. permitting crystallization of the thermoelectric material for a short period of up to about 3 minutes.

The pressure is at least 1000 kgf/cm² so as to break down the oxide film formed on the surface of the powder and to eliminate the increase of electric resistance. The high pressure is also intended to increase the sintering density and to thereby obtain a thermoelectric material of high performance index.

It is desired to press the material hot for sintering at a higher pressure insofar as troubles are avoidable with respect to the strength of the die. A greater force is then available for breaking down the oxide film. Specifically stated, the pressure is preferably at least 2000 kgf/cm², more preferably at least 3000 kgf/cm².

The pressing time is within 3 minutes to inhibit to the greatest possible extent the growth of crystal grains of the crystallized thermoelectric material. The lower limit of the pressing time is determined generally as the period of time required to obtain a compact sintered body. This time is generally at least about 20 seconds although variable depending on the type of material powder, pressing temperature, pressure and like conditions. The time can be shorter than about 20 seconds insofar as the compact sintered body is available.

The above conditions for hot pressing are not limited to thermoelectric elements comprising electrodes and a thermoelectric material joined thereto like the thermoelectric elements of the invention but are also usable for merely preparing sintered bodies of thermoelectric powders.

Figure 8:
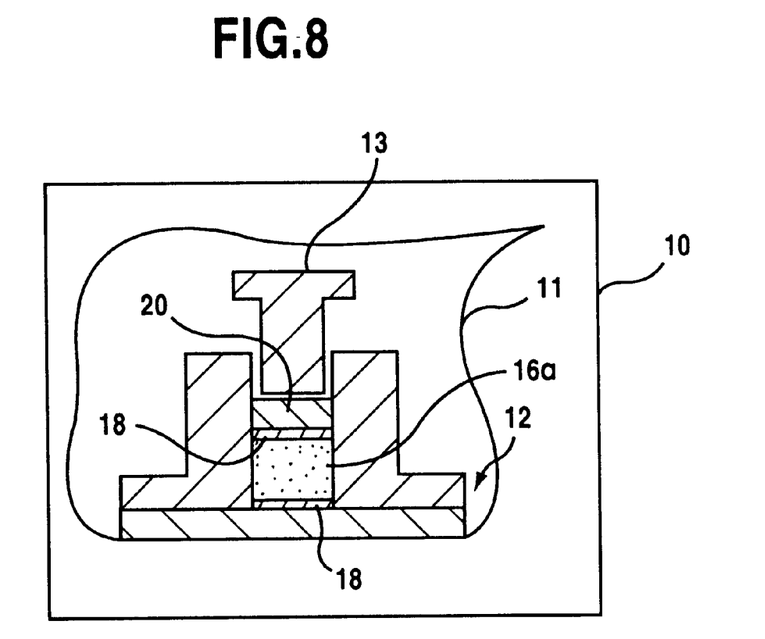
FIG. 8 is a diagram for illustrating the step of sealing a die in its entirety using a container of gas-impermeable material within a glove chamber.

The plate member 20 used prevents ingress of oxygen into the thermoelectric material to some extent, whereas use of a baglike container 11 in combination with the plate member as shown in FIG. 8 is also effective for minimizing the influence of oxygen in air. With reference to FIG. 8, an electrode plate 18, thermoelectric material powder 16a, electrode plate 18 are successively placed into a die 12, a plate member 20 and punch 13 are further placed in, and the die 12 is then placed into the baglike container 11 having an indefinite shape and made of a gas-impermeable material. The baglike container 11 can be, for example, a synthetic resin bag having a large thickness and commercially available.

Figure 9:
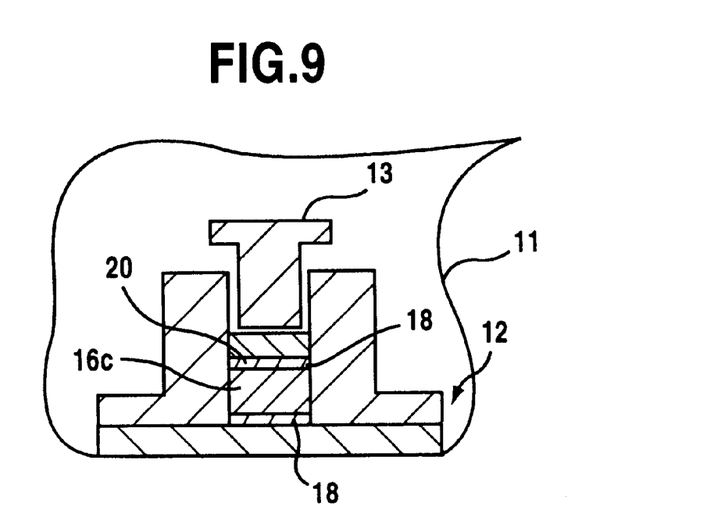
FIG. 9 is a diagram for illustrating the step of forming a powder of thermoelectric material into a premolded body.

The die placed in the container 11 is subsequently withdrawn from the chamber 10 of oxygen-free atmosphere, brought to the work station of the press, and the punch 13 is caused to press the plate member 20 with a force applied thereto from outside the container 11, whereby the powder of thermoelectric material 16a is made into a premolded body 16c (see FIG. 9).

Figure 10:
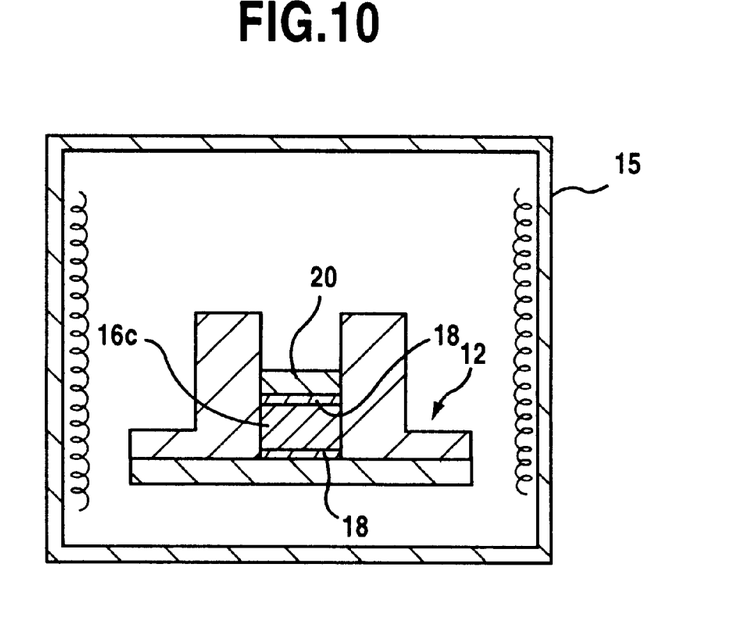
FIG. 10 is a diagram for illustrating the step of heating the premolded body in a heater in the atmosphere.

With the baglike container 11 and the punch 13 thereafter removed, the premolded body 16c is heated to a temperature of 300 to 550 deg C. in a heater 15 as shown in FIG. 10. To prevent the premolded body 16c from being oxidized over the surface, the body 16c is placed into the heater 15, with the plate member 20 on the body.

Figure 11:
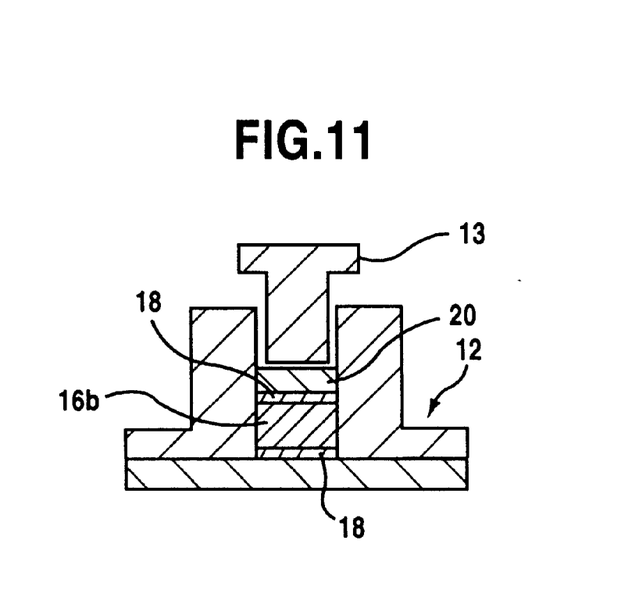
FIG. 11 is a diagram for illustrating the step of forming the premolded body into a compact molded body of thermoelectric material.

The premolded body 16c heated to the predetermined temperature and contained in the die is promptly brought to the work station of the press, where the plate member 20 is pressed by a punch placed thereon, whereby the premolded body 16c is made into a more compact molded body 16b of thermoelectric material (see FIG. 11).

Unlike the powder 16a, the premolded body 16c is almost free of the penetration of air thereinto and is therefore free of the influence of oxygen, so that even if subsequently sintered under pressure in the atmosphere, the premolded body provides a molded body which is comparable in thermoelectric performance to the thermoelectric molded body prepared by hot pressing in a vacuum or nitrogen gas atmosphere or like oxygen-free atmosphere.

Figure 3:
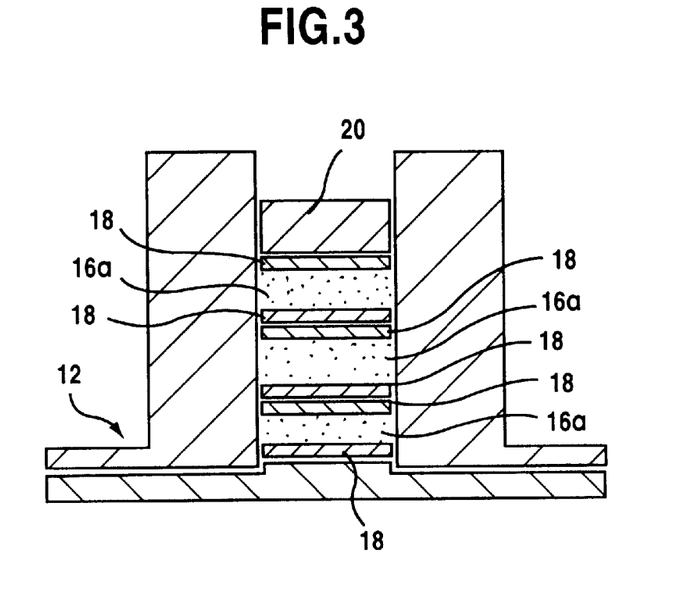
FIG. 3 is a view for illustrating an embodiment wherein the superposed layers of electrode plate, powder of thermoelectric material and electrode plate are placed in a plurality of sets within a die.

A plurality of electrode-incorporating thermoelectric elements can be fabricated at a time by repeating the step of successively superposing the electrode plate 18, thermoelectric material powder 16a and electrode plate 18 to form a plurality of layers of powder 16a, and pressing the assembly once as seen in FIG. 3. When a release agent is applied between the adjacent electrode plates, the assemblies can be readily separated after pressure sintering.

Figure 4:
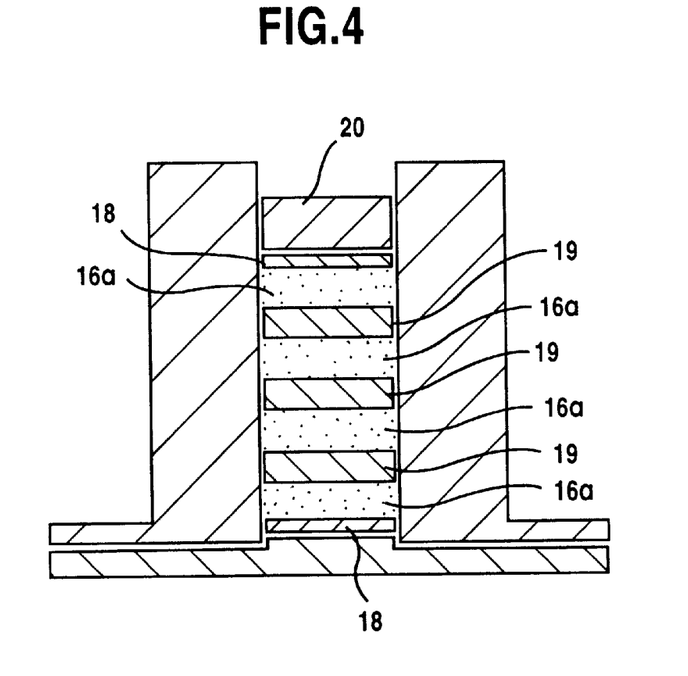
FIG. 4 is a view for illustrating another embodiment wherein a plurality of similar superposed layers are placed in a die.
Figure 5:
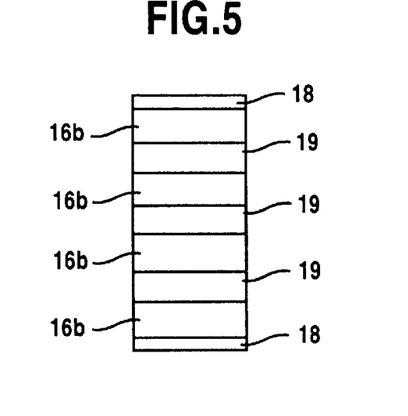
FIG. 5 is a front view showing a thermoelectric element prepared by the process illustrated in FIG. 4.

Further as shown in FIG. 4, a plurality of thermoelectric elements can be prepared similarly by successively superposing the electrode plate 18, thermoelectric material powder 16a and a thick electrode plate member 19 having approximately twice the thickness of the electrode plate 18, and subsequently performing the step of superposing the thermoelectric powder 16a and a thick electrode plate member 19 at least once. The uppermost electrode plate has the same thickness as the lowermost electrode plate 18. With this embodiment, each electrode plate member 19 between the thermoelectric members 16b, 16b needs to be cut after sintering as indicated in dot-and-dash lines in FIG. 5.

(iv) Characteristics Evaluation of Thermoelectric Elements Prepared by Hot Pressing

[Relationship between Pressure of Hot Pressing and Thermoelectric Performance]

Specified quantities of the elements Bi, Te and Sb were weighed out for preparing the composition $(Bi_2Te_3)_{0.25}$ $(Sb_2Te_3)_{0.75}$, and pulverized and mixed together in a ball mill to obtain a thermoelectric material powder having a mean particle size of about 10 µm.

The powder was pressed hot under the conditions listed in Table 1 and including varying pressures to prepare thermoelectric materials for testing. Table 1 also shows the density ratio and properties of each material obtained.

The optimum thermoelectric efficiency achieved by the thermoelectric material is dependent on the thermoelectric performance index of the material. The performance index is expressed by the following equation.

$$Z=\alpha^2/\rho\kappa(1/K)$$

wherein $\alpha$ is the Seebeck coefficient (V/K), $\rho$ is electric resistance ($\Omega \cdot m$), and $\kappa$ is thermal conductivity (W/m·K). The greater the performance index Z, the greater is the thermoelectric efficiency.

TABLE 1

| Specimen No. | Hot Pressing Condition | | | | Density Ratio (%) | Seebeck Coefficient α (V/K) | Electric Resistance ρ (Ω · m) | Thermal Conductivity κ (W/m · K) | Performance Index Z (1/K) |
|---|---|---|---|---|---|---|---|---|---|
| | Temp. (° C.) | Pressure (kg/cm²) | Time | Atmosphere | | | | | |
| 1 | 500 | 450  | 60 min | Ar gas | 98.2 | $0.192 \times 10^{-3}$ | $0.0100 \times 10^{-3}$ | 1.23 | $3.0 \times 10^{-3}$ |
| 2 | 500 | 450  | 60 min | Air    | 97.5 | $0.189 \times 10^{-3}$ | $0.0161 \times 10^{-3}$ | 1.16 | $1.9 \times 10^{-3}$ |
| 3 | 500 | 1000 | 20 sec | Air    | 98.5 | $0.196 \times 10^{-3}$ | $0.0128 \times 10^{-3}$ | 1.20 | $2.5 \times 10^{-3}$ |
| 4 | 500 | 2000 | 20 sec | Air    | 99.5 | $0.203 \times 10^{-3}$ | $0.0102 \times 10^{-3}$ | 1.26 | $3.2 \times 10^{-3}$ |
| 5 | 500 | 3000 | 20 sec | Air    | 99.9 | $0.227 \times 10^{-3}$ | $0.0090 \times 10^{-3}$ | 1.30 | $4.4 \times 10^{-3}$ |
| 6 | 500 | 4000 | 20 sec | Air    | 99.9 | $0.224 \times 10^{-3}$ | $0.0086 \times 10^{-3}$ | 1.33 | $4.4 \times 10^{-3}$ |

With reference to Table 1, specimen No. 1 was prepared by pressing the powder hot in an Ar gas atmosphere under the conventional pressure condition, specimen No. 2 was obtained by effecting hot pressing in the atmosphere under the conventional pressure condition, and specimens No. 3 to No. 6 were prepared by effecting hot-pressing in the atmosphere under the pressure condition of the invention.

Each of the specimens was sufficiently high in density ratio and fully compacted. The density ratio is the ratio of the density of the molded body to that of a perfectly compacted body. The density of the molded body was measured by the Archimedes method.

Specimen No. 1 was obtained by hot pressing in Ar gas and is therefore satisfactory in performance index even if the pressure applied is 450 kg/cm², but specimen No. 2 obtained by hot pressing in the atmosphere is greater in electric resistance and smaller in performance index. The increased electric resistance of specimen No. 2 is thought attributable to a great influence of oxide film.

On the other hand, a comparison between specimens No. 2 to No. 6 reveals that although the atmosphere was used, the electric resistance decreases and the performance index increases with an increase in the pressure applied for pressing. This appears attributable to the fact that the increase of pressure shortens the treatment time for hot pressing, diminishes the formation of oxide film and affords a greater force for breaking down the oxide film, consequently reducing the influence of the oxide film which increases the electric resistance.

[Relationship between Hot Pressing Time and Thermoelectric Performance]

Specified quantities of elements were weighed out, and pulverized and mixed together in a ball mill in the same manner as in the forgoing example to prepare a thermoelectric material powder having a mean particle size of about 5 μm.

Specimens of thermoelectric materials were prepared by placing the powder into a press die, placing the die into a die heating furnace as heated to 550° C., sintering the powder at a pressure of 3000 kg/cm² when the powder was heated to 500° C., thereafter promptly withdrawing the sintered product from the die and forcibly cooling the product as placed on a metal work table by a fan. The powder was pressed hot in the atmosphere. Table 3 shows the pressing time, and the density ratio, Hall mobility and physical properties of the specimens obtained.

In Table 2, specimen No. 11 is a comparative example with a shorter pressing time, specimens No. 12 to No. 14 are examples of the invention, and specimen No. 15 is a comparative example with a longer pressing time than is specified by the invention.

TABLE 2

| Specimen No. | Hot Pressing Time | Density Ratio (%) | Hall Mobility (cm²/Vs) | Seebeck Coefficient α (V/K) | Electric Resistance ρ (Ω · m) | Thermal Conductivity κ (W/m · K) | Performance Index Z (1/K) |
|---|---|---|---|---|---|---|---|
| 11 | 6 sec  | 89.6  | 90  | $0.123 \times 10^{-3}$ | $0.0098 \times 10^{-3}$ | 1.55 | $1.00 \times 10^{-3}$ |
| 12 | 20 sec | 99.1  | 108 | $0.131 \times 10^{-3}$ | $0.0090 \times 10^{-3}$ | 1.62 | $1.18 \times 10^{-3}$ |
| 13 | 1 min  | 99.5  | 131 | $0.135 \times 10^{-3}$ | $0.0083 \times 10^{-3}$ | 1.72 | $1.28 \times 10^{-3}$ |
| 14 | 3 min  | 99.8  | 117 | $0.132 \times 10^{-3}$ | $0.0082 \times 10^{-3}$ | 1.74 | $1.22 \times 10^{-3}$ |
| 15 | 10 min | 100.0 | 105 | $0.118 \times 10^{-3}$ | $0.0083 \times 10^{-3}$ | 1.87 | $0.90 \times 10^{-3}$ |

Specimen No. 11, one of the comparative examples, has a low density ratio of 89.6%, which indicates that it has not been fully sintered, whereas specimens No. 12 to No. 15 are as high as at least about 99% in density ratio, hence fully compacted sintered bodies.

In the Hall mobility, specimen No. 11, comparative example, is smaller than specimens No. 12 to No. 15 and therefore inferior in thermoelectric performance. The Hall mobility is an index representing the distance electrons or holes move per unit voltage per unit time and correlated with the thermoelectric performance. The greater the Hall mobility, the more excellent is the thermoelectric performance. Specimen No. 11 has not been fully crystallized presumably because the specimen is much shorter in pressing time at a temperature not lower than the crystallization temperature as compared with specimens No. 12 to No. 15.

With respect to thermal conductivity, specimen No. 15, the other comparative example, is greater than specimens No. 12 to No. 14, and is consequently smaller in performance index. This is presumably because with specimen No. 15 which is exceedingly longer than specimens No. 12 to No. 14 in pressing time, the growth of the crystal grains has proceeded to a greater extent to result in a greater thermal conductivity.

2. Thermoelectric Modules

A description will be given of examples of thermoelectric modules fabricated with use of the thermoelectric elements described.

Figure 15:
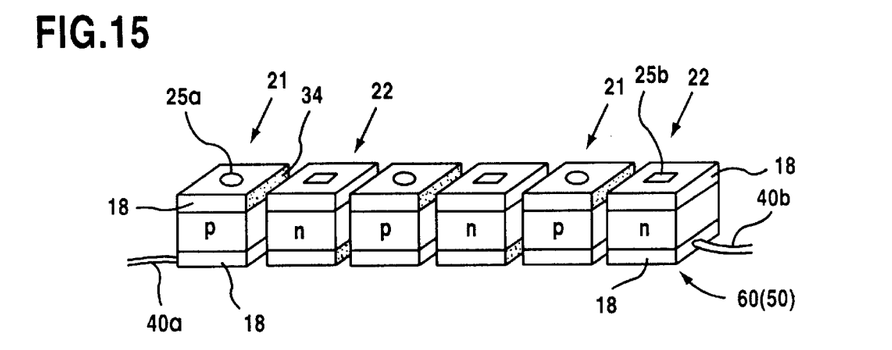
FIG. 15 is a perspective view of a thermoelectric module obtained by cutting the soldered assembly along the dot-and-dash line in FIG. 14.
Figure 21:
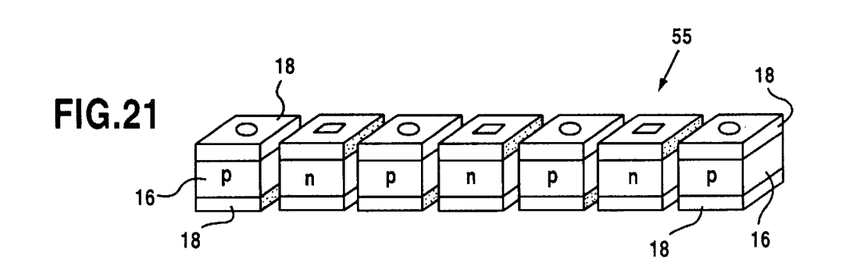
FIG. 21 is a perspective view of the p—p type submodule.
Figure 22:
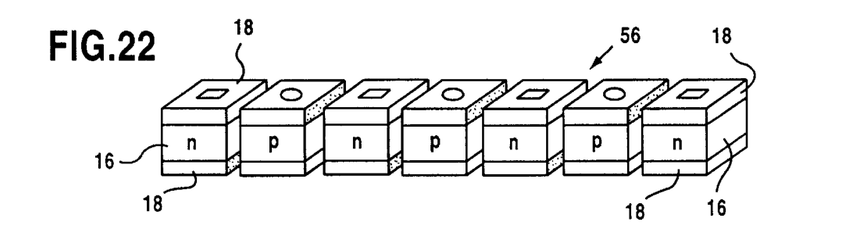
FIG. 22 is a perspective view of the n—n type submodule.

The thermoelectric module provided by the present invention is, in the broad sense of the term, one comprising p-type thermoelectric elements and n-type thermoelectric elements arranged alternately in a row and electrically connected in series by electrode plates as shown in FIGS. 15, 21 or 22.

The fabrication of the thermoelectric module of single-row construction will be described first.

(i) Fabrication of Thermoelectric Module of Single-Row Construction

Figure 12:
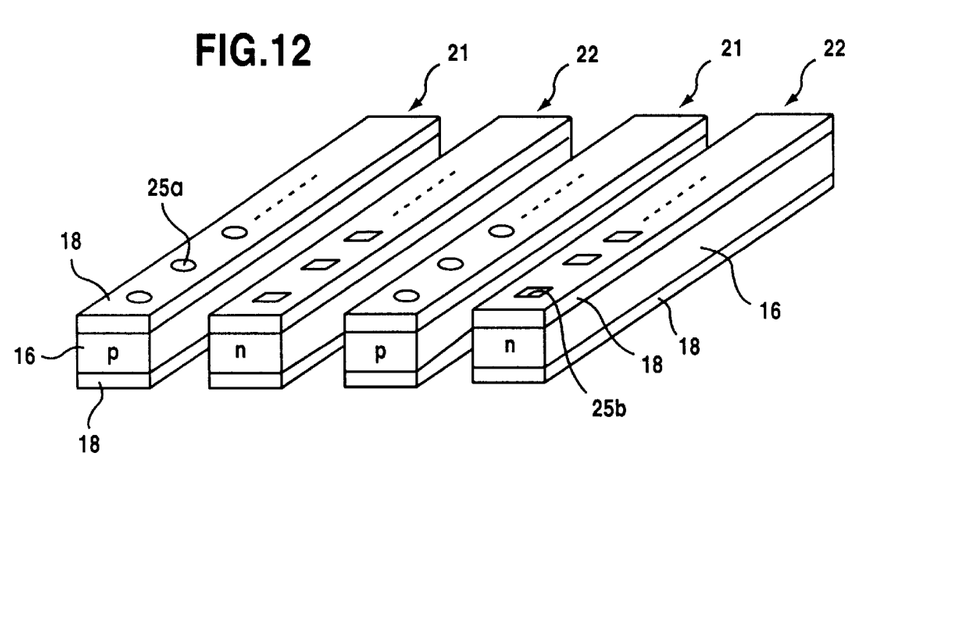
FIG. 12 is a perspective view showing p-type thermoelectric elements and n-type thermoelectric elements alternately arranged at a predetermined interval.

As shown in FIG. 12, p-type thermoelectric elements 21 and n-type thermoelectric elements 22 are arranged alternately, each of the elements 21, 22 comprising a p-type or n-type thermoelectric material 16 provided between and joined to a pair of opposed slender electrode plates 18, 18. The number of thermoelectric elements is suitably determined.

With the illustrated embodiment, the electrode plates 18, 18 of the p-type thermoelectric element 21 are each formed with circular holes 25a, and the electrode plates 18, 18 of the n-type thermoelectric element 22 with square holes 25b.

Figure 13:
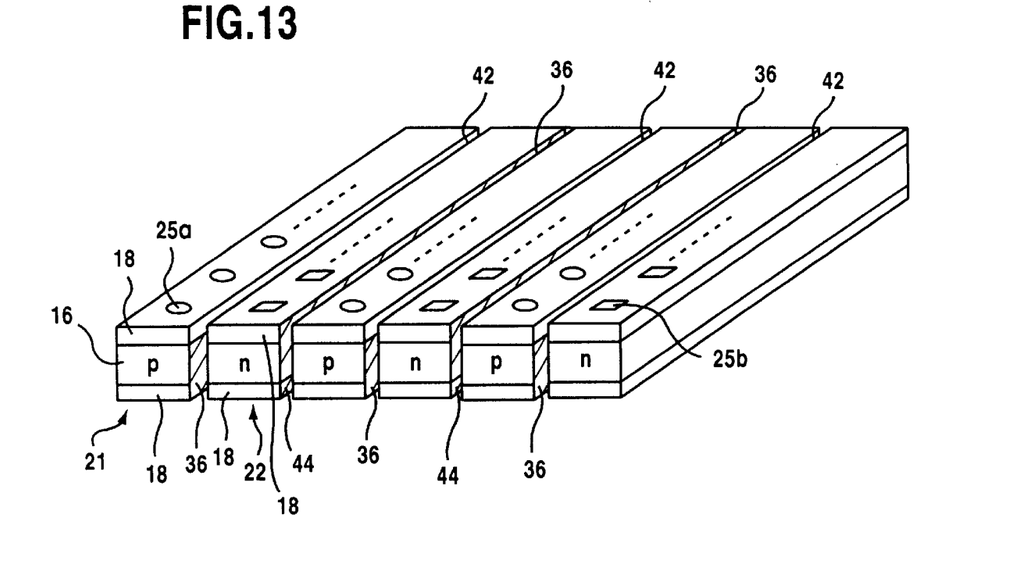
FIG. 13 is a diagram for illustrating the step of inserting a spacer into the clearance between each pair of adjacent thermoelectric elements.

With reference to FIG. 13, a spacer 36 in the form of a plate is inserted between each pair of adjacent p-type thermoelectric element 21 and n-type thermoelectric element 22 so as to form upper clearances 42 and lower clearances 44 as arranged alternately. The spacer 36 is made of Teflon resin or the like and has a length equal to the combined thickness of one electrode plate 18 and the thermoelectric material 16. The spacers 36 serve to arrange the thermoelectric elements in a row at a predetermined interval and prevent solder from adhering to the portions other than where soldering is required when the electrodes are to be soldered.

Next, solder 34 is applied to interconnect the upper electrodes 18, 18 adjacent to each other with each odd-numbered clearance 42 provided by the spacer 36, and the lower electrodes 18, 18 adjacent to each other with each even-numbered clearance 44 provided by the spacer 36. The solder is merely a typical kind of brazing material, and a brazing material other than solder is of course usable.

The soldering method will be described in detail.

When the upper electrode plates 18, 18 on opposite sides of the (odd-numbered) clearance 42 closest to the left end of FIG. 13 are interconnected, the lower electrode plates 18, 18 on opposite sides of the (even-numbered) clearance 44 adjacent to the clearance 42 are next interconnected by soldering. Subsequently, the upper electrode plates 18, 18 on opposite sides of the third (odd-numbered) clearance 42 from the left end are soldered. In this way, the electrode plates are soldered repeatedly. Soldering may be done alternately in this way from one end, or on one side first, or on both sides at the same time. From the viewpoint of work efficiency, it is desirable to treat one side first, then turn the arrangement upside down, and treat the other side.

Removal of the spacers 36 after soldering provides a thermoelectric module wherein the p-type thermoelectric elements 21 and the n-type thermoelectric elements 22 are electrically connected in series via the electrode plates.

Figure 14:
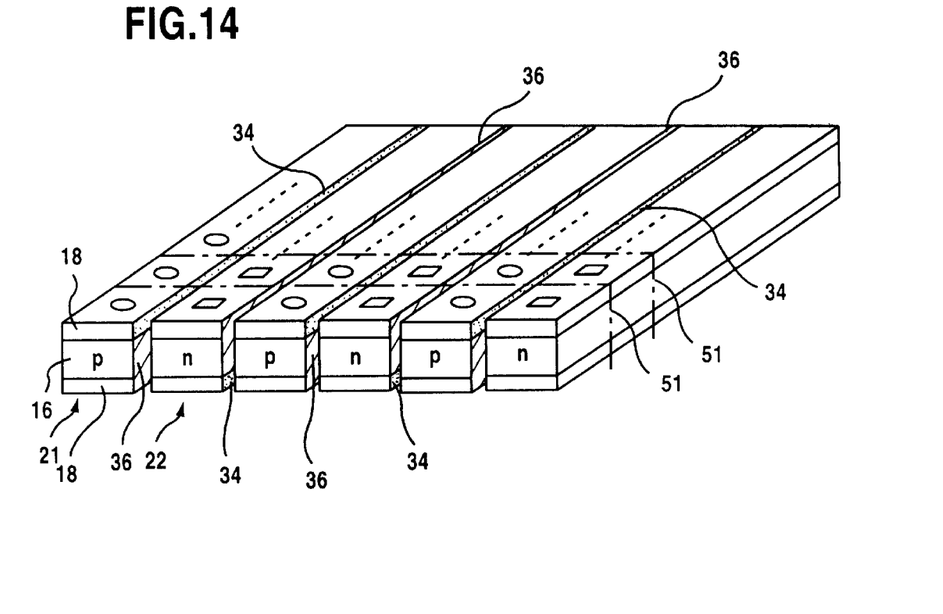
FIG. 14 is a diagram for illustrating the step of soldering the resulting arrangement including the inserted spacers.

When required, the resulting assembly can be cut at a predetermined interval before removing the spacers 36 as indicated in dot-and-dash lines 51, 51 in FIG. 14. When the spacers 36 are removed after cutting, slender thermoelectric modules 60 of single-row construction can be obtained as shown in FIG. 15. When the module is to be used as it is, terminals 40a, 40b for connecting to a device are attached to the respective electrode plates 18, 18 serving as the base end and terminal end of the electric series circuit.

To reinforce the thermoelectric module, it is desired to fill resin 38 into the spaces resulting from the removal of the spacers 36. When the surfaces of the electrode plates are covered with the resin 38, the resin serves also as an electrical insulating material for the module. Accordingly, the entire module is covered with the resin 38 as seen in FIG. 16 after removing the spacers 36 and attaching the terminals 40a, 40b.

In the case where the module is covered with the resin 38, the spacers 36 need not always be removed, with the resin may be applied to the module with the spacers remaining therein.

Figure 16:
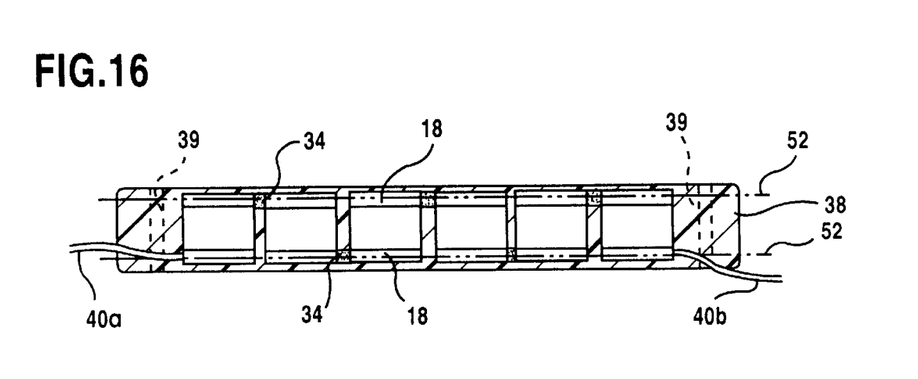
FIG. 16 is a sectional view of the thermoelectric module as covered with a resin.

The resin 38 is thereafter removed by surface grinding or cutting to expose the surfaces of the electrode plates as indicated in dot-and-dash lines 52, 52 in FIG. 16. This step gives improved surface smoothness and an accurately adjusted thickness to the thermoelectric module. When there is a need to cause the resin 38 to serve as an insulator, the resin surface is ground or cut as required to a thickness that will not adversely affect heat transfer.

If the resin layer is so formed as to project or extend sideways from the mounting, a bore 39 can be formed in the extensions for mounting a heat exchanger (see FIG. 16).

Cement or ceramic is usable in place of the resin. In this case, a slurry or solution of cement or ceramic in water or suitable solvent is poured into a die for the module and thereafter dried.

(ii) Fabrication of Thermoelectric Modules Comprising a Plurality of Elements

Thermoelectric modules each comprising p-type thermoelectric elements and n-type thermoelectric elements alternately arranged in a row are prepared as submodules, and the submodules are used for fabricating a thermoelectric module composed of an increased number of elements by the processes to be described below.

The term "submodule" refers, for example, to the same module as the thermoelectric module 60 shown in FIG. 15 and as prepared before the connecting terminals 40a, 40b are attached thereto.

Depending on the mode of electrical series connection of the components, the submodules available include a p–n type (n–p type) submodule 50 having a p-type thermoelectric element at one end and an n-type thermoelectric element at the other end as shown in FIG. 15, a p—p type submodule 55 having a p-type element at each end as seen in FIG. 21, and an n—n type element at each end as shown in FIG. 22.

When the term "thermoelectric module" is merely mentioned in the following description, the term refers to a module comprising a plurality of rows of elements, i.e., p-type thermoelectric elements and n-type thermoelectric elements arranged in vertical and horizontal rows in a flat form as shown, for example, in FIGS. 17 or 20.

[First Embodiment]

A process will be described below for fabricating the thermoelectric module 60 shown in FIG. 17 using p–n type submodules 50.

Figure 17:
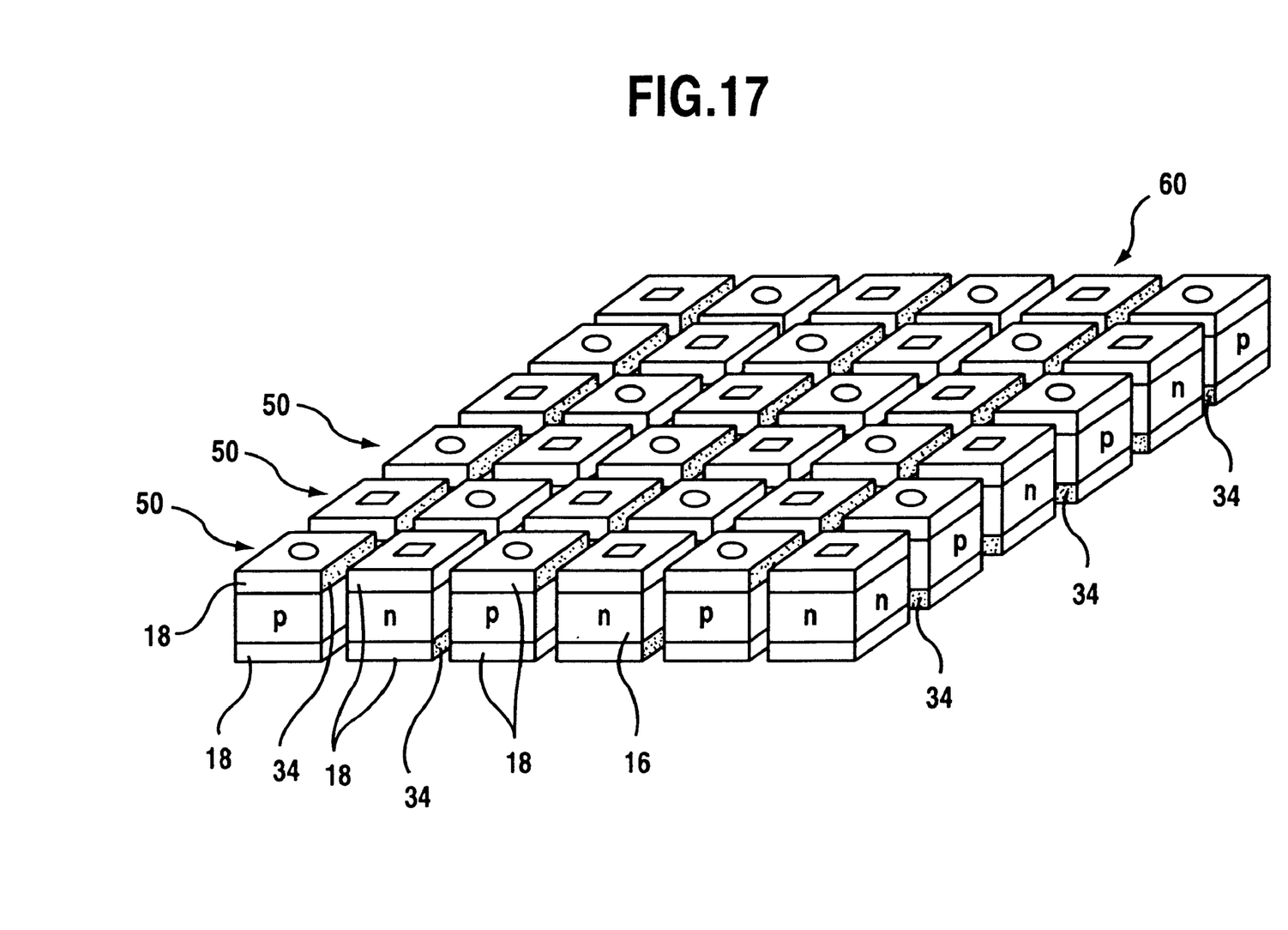
FIG. 17 is a perspective view of a thermoelectric module comprising a plurality of rows of thermoelectric elements, i.e., p–n type submodules arranged side by side and interconnected by soldering.

With reference to FIG. 17, submodules 50 are arranged in a plurality of rows. The submodule in an odd-numbered row and the submodule in an even-numbered row are in a reversed relation with respect to the right-left direction. A spacer is inserted between each pair of adjacent submodules 50, 50 in the same manner as previously described so that the entire arrangement has upper clearances and lower clearances as suitably disposed.

Next, with respect to each pair of adjacent submodules 50, 50, the electrode plates 18, 18 positioned at one end are interconnected with solder 34, whereby all the submodules 50 are electrically connected in series.

Figure 19:
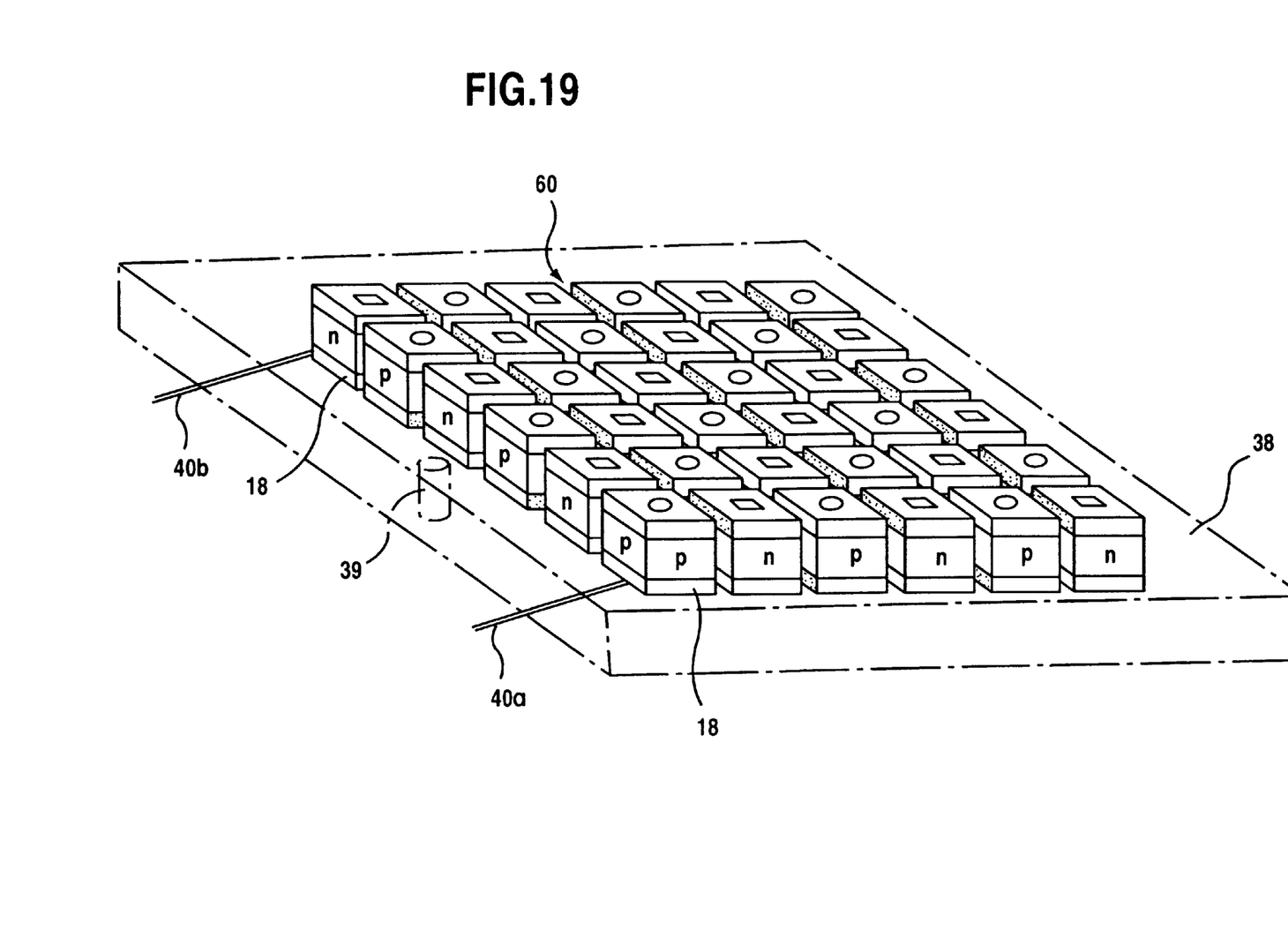
FIG. 19 is a perspective view of the module shown in FIG. 18 as it is viewed from a different position.

The position of interconnection between the adjacent submodules with the solder 34 will be described in greater detail. The first row and the second row from the front are connected at the right end (see FIG. 17), the second row and the third row are connected to the left end (see FIG. 19), and the third row and the fourth row are connected at right end again (see FIG. 17). In this way, the pairs of adjacent submodules are interconnected at the right and the left alternately.

To the thermoelectric module 60 thus fabricated are attached device connecting terminals 40a, 40b at the electrode plates 18 serving respectively as the base end of the electrical series circuit and the terminal end thereof. Preferably, the module 60 is then covered in its entirety with resin, cement or ceramic. The covering is thereafter suitably cut, and when required, machined to expose the surfaces of electrode plates. A bore 39 for mounting on a heat exchanger is formed in extensions of resin 38.

[Second Embodiment]

A process will be described for fabricating a thermoelectric modules 60 with use of p—p type submodules 55 and n—n type submodules 56.

Figure 20:
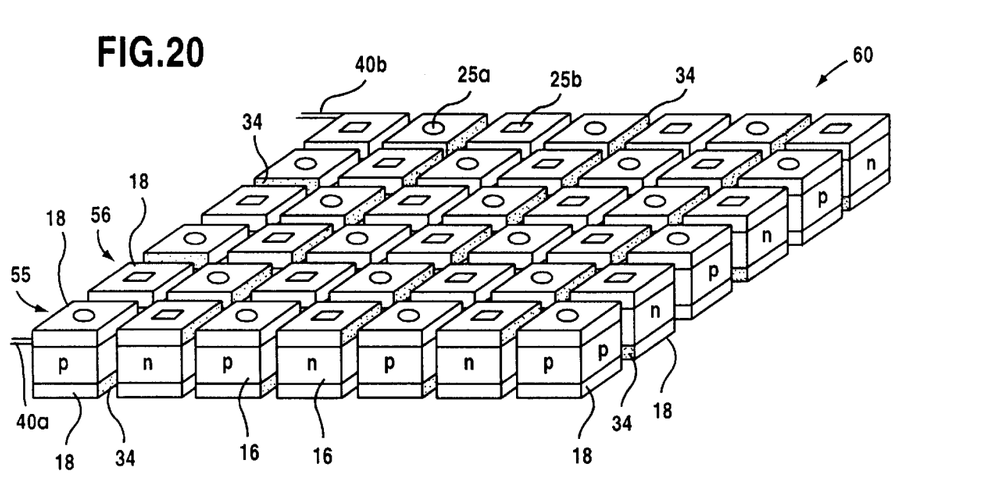
FIG. 20 is a perspective view of a thermoelectric module prepared with use of p—p type submodules and n—n type submodules.

With reference to FIG. 20, p—p type submodules 55 and n—n type submodules 56 are arranged alternately so that the unsoldered electrode of the thermoelectric element providing an electrical end of each submodule will be positioned adjacent to the unsoldered electrode of corresponding element of another submodule adjacent to the submodule, and these adjacent electrode plates are interconnected by soldering so as to electrically connect all the submodules in series, whereby a thermoelectric module 60 is prepared.

Attachment of device connecting terminals to electrode plates, use of resin and surface grinding or cutting are done or made in the same manner as in the case of the foregoing thermoelectric module, and therefore will not be described again.

With the thermoelectric element incorporating electrode plates and embodying the invention, the thermoelectric material is joined to the electrodes before such elements are assembled into a thermoelectric module, so that the process for fabricating the module does not require a sequence of solder joining steps and is therefore simplified.

A multiplicity of electrode-incorporating thermoelectric elements can be obtained at a time by preparing a thermoelectric element of the such type in the form of a plate and suitably cutting the platelike element. Furthermore, a plurality of electrode-incorporating thermoelectric elements can be prepared at a time by placing sets of superposed layers of electrode plates and powder of thermoelectric material into a die and heating and pressing the assembly.

Figure 18:
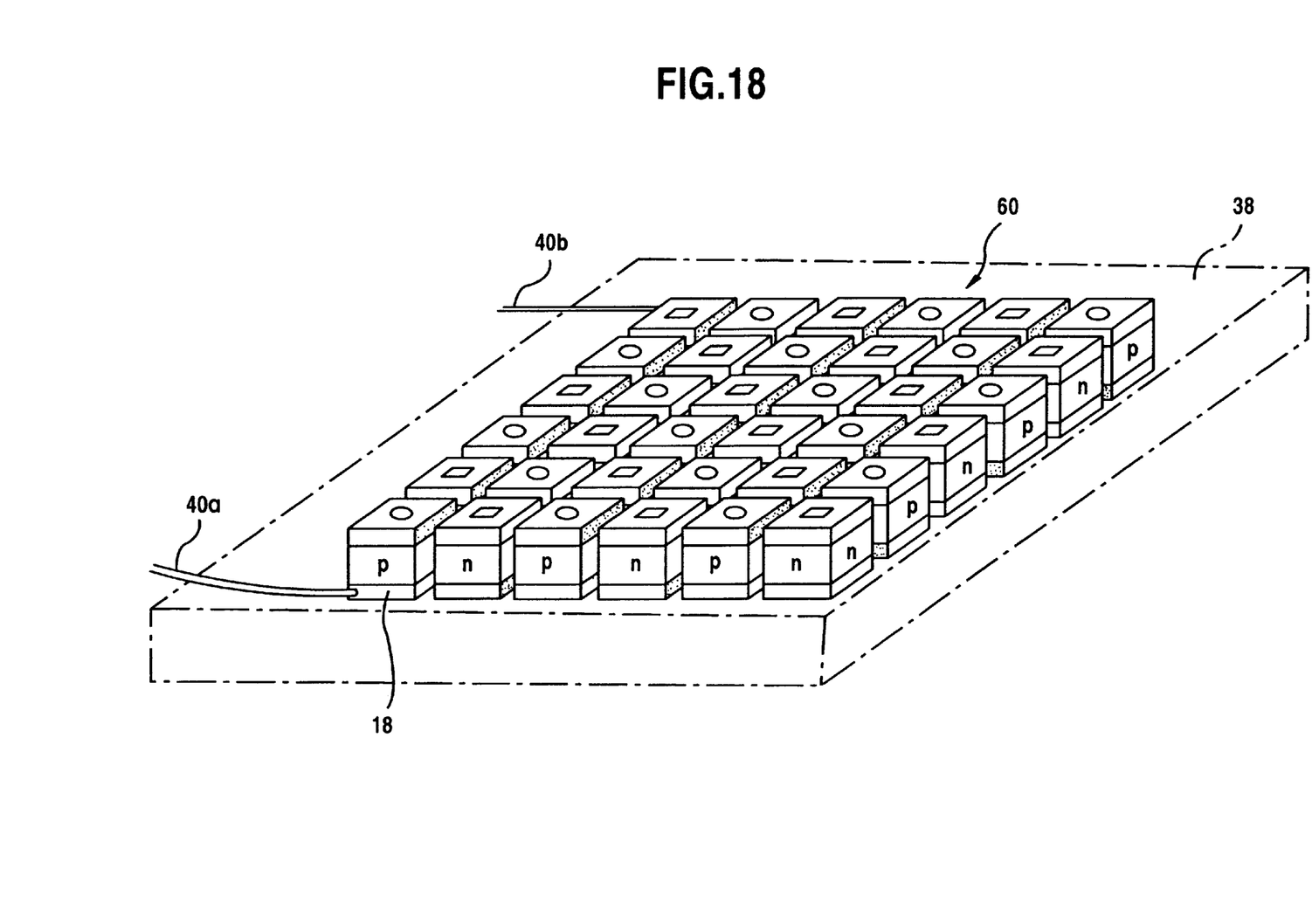
FIG. 18 is a perspective view of the thermoelectric module of FIG. 17 covered with a resin and thereafter cut and ground to remove the resin from unnecessary portions and from the upper side of electrode plates.

The process for producing thermoelectric modules of the invention is also simplified. Especially in fabricating the module comprising a plurality of rows of elements and shown in FIGS. 18 or 20, the component thermoelectric elements remain unseparated into individual elements and can be handled at least in the form of a slender or elongated assembly until the final step of fabrication. This results in a greatly improved work efficiency.

What is claimed is:

1. A process for producing a thermoelectric element comprising a pair of opposed electrode plates and a thermoelectric material provided between and joined to the electrode plates, the process comprising the steps of:

placing an electrode plate, a powder of thermoelectric material and an electrode plate into a die in superposed layers, and thereafter sintering the powder with a pressure applied thereto perpendicular to the superposed layers to join the electrode plates and the thermoelectric material into an integral assembly.

2. The process for producing a thermoelectric element as defined in claim 1 which comprises performing plural times the step of successively placing an electrode plate, a powder of thermoelectric material and an electrode plate into a die in superposed layers.

3. The process for producing a thermoelectric element as defined in claim 1 further comprising the step of:

superposing an electrode plate member having approximately twice the thickness of the electrode plate and the powder of thermoelectric material on the powder after placing the powder on the electrode plate, subsequently placing the electrode plate over the powder, sintering the powder with a pressure applied thereto perpendicular to the layers to obtain an integrally joined assembly, and thereafter cutting the electrode plate member in parallel to a surface of the plate member to obtain a plurality of thermoelectric elements.

4. The process for producing a thermoelectric element as defined in claim 1 wherein the electrode plate has a surface to be in contact with the thermoelectric material and formed with intersecting grooves extending vertically and horizontally, and the powder of thermoelectric material fills the grooves and is sintered.

5. The process for producing a thermoelectric element as defined in claim 1 wherein the electrode plate is formed with a hole, and the powder of thermoelectric material fills the hole and is sintered.

6. The process for producing a thermoelectric element as defined in claim 1 wherein the powder of thermoelectric material is sintered by hot pressing, and the pressure applied for hot pressing is at least 1000 kg/cm$^2$.

7. The process for producing a thermoelectric element as defined in claim 1 wherein the powder of thermoelectric material is sintered by hot pressing effected at a temperature permitting crystallization of the thermoelectric material for up to 3 minutes, and the sintered material is forcibly cooled to a temperature not permitting progress of crystallization.

8. The process for producing a thermoelectric element as defined in claim 1 which comprises placing the electrode plate, the powder of thermoelectric material and the electrode plate in superposed layers into the die within a chamber having an oxygen-free atmosphere, thereafter closing the entire die, withdrawing the die as substantially held closed from the oxygen-free atmosphere, pressing the superposed layers to form a premolded body, and sintering the premolded body with application of pressure.

9. The process for producing a thermoelectric element as defined in claim 1 which comprises placing the electrode plate, the powder of thermoelectric material and the electrode plate in superposed layers into the die within a chamber having an oxygen-free atmosphere, thereafter accommodating the die in a container made of gas-impermeable material to seal the entire die, withdrawing the die accommodating container from the oxygen-free atmosphere, pressing the superposed layers from outside the container to form a premolded body, and sintering the premolded body with application of pressure.

* * * * *